United States Patent
Miyama

(10) Patent No.: US 9,659,752 B2
(45) Date of Patent: May 23, 2017

(54) METHOD FOR PRESETTING TUNER OF PLASMA PROCESSING APPARATUS AND PLASMA PROCESSING APPARATUS

(71) Applicant: TOKYO ELECTRON LIMITED, Tokyo (JP)

(72) Inventor: Ryo Miyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/000,228

(22) Filed: Jan. 19, 2016

(65) Prior Publication Data

US 2016/0211120 A1    Jul. 21, 2016

(30) Foreign Application Priority Data

Jan. 20, 2015 (JP) ................................. 2015-008937

(51) Int. Cl.
  *H01J 37/32* (2006.01)
(52) U.S. Cl.
  CPC .... *H01J 37/32266* (2013.01); *H01J 37/3299* (2013.01); *H01J 37/32256* (2013.01); *H01J 37/32972* (2013.01)
(58) Field of Classification Search
  USPC ....................................... 315/111.21, 111.41
  See application file for complete search history.

(56) References Cited

U.S. PATENT DOCUMENTS

2008/0100222 A1* 5/2008 Lewington .......... H01J 37/3255
  315/111.21
2008/0100223 A1* 5/2008 Lewington ........ H01J 37/32009
  315/111.21

FOREIGN PATENT DOCUMENTS

JP  5-94955 A  4/1993
JP  6-188221 A  7/1994

* cited by examiner

*Primary Examiner* — Douglas W Owens
*Assistant Examiner* — Jianzi Chen
(74) *Attorney, Agent, or Firm* — Rothwell, Figg, Ernst & Manbeck, P.C.

(57) ABSTRACT

Disclosed is a method for presetting a tuner that matches a power required for plasma emission in a plasma processing apparatus. The method includes: obtaining a relationship of a time lapse from power supply, an emission intensity of plasma, and a setting position of the tuner by emitting plasma; differentiating the emission intensity by time to calculate a time when an increase rate of the emission intensity becomes maximum; and setting the setting position of the tuner at a time, which is obtained by subtracting a time required from the setting of the tuner until the setting is reflected on the emission intensity from the time when the increase rate of the emission intensity becomes maximum, as a preset position.

3 Claims, 9 Drawing Sheets

*FIG.6*

| T1 \ T2 | -30 | -20 | -10 | 0 | 10 | 20 | 30 |
|---|---|---|---|---|---|---|---|
| -30 | × | × | △ | ○ | ○ | ○ | ○ |
| -20 | × | △ | ○ | ○ | ○ | ○ | ○ |
| -10 | × | ○ | ○ | ○ | ○ | ○ | ○ |
| 0 | × | ○ | ○ | ○ | ○ | ◎ | ○ |
| 10 | × | ○ | ○ | ○ | ◎ | ○ | ○ |
| 20 | × | ○ | ○ | ○ | ○ | ○ | ○ |
| 30 | × | ○ | ○ | ○ | ○ | ○ | × |

METHOD FOR PRESETTING TUNER OF PLASMA PROCESSING APPARATUS AND PLASMA PROCESSING APPARATUS

CROSS-REFERENCE TO RELATED APPLICATIONS

This application is based on and claims priority from Japanese Patent Application No. 2015-008937, filed on Jan. 20, 2015, with the Japan Patent Office, the disclosure of which is incorporated herein in its entirety by reference.

TECHNICAL FIELD

The present disclosure relates to a method for presetting a tuner of a plasma processing apparatus that generates plasma by using microwaves and performs a plasma processing on a processing target object, and a plasma processing apparatus.

BACKGROUND

A semiconductor device, an organic EL device, or the like is manufactured by performing a processing such as, for example, etching, chemical vapor deposition (CVD), or sputtering, on a substrate to be processed. Conventionally, as a plasma processing apparatus that performs a predetermined plasma processing on a processing target object such as, for example, a semiconductor wafer, a plasma processing apparatus using a radial line slot antenna has been known. The radial line slot antenna is provided above a dielectric window that is provided in a ceiling opening of a processing container in a state in which a slow wave plate is provided on a slot plate having a plurality of slots, and the center of the radial line slot antenna is connected with a coaxial waveguide. With this configuration, microwaves generated by a microwave generator are radially transmitted by the slow wave plate in the diametrical direction via the coaxial waveguide, generate circularly polarized waves by the slot plate, and then, are radiated from the slot plate to the inside of the processing container through the dielectric window. Then, high density plasma having a low electron temperature may be generated by the microwaves under a low pressure in the processing container. A plasma processing such as, for example, a film forming processing or an etching processing, is performed using the generated plasma.

In such a plasma processing, it is required to perform a stable plasma processing in order to improve a yield. However, a phenomenon that plasma ignition is failed or delayed may happen. When the ignition is delayed, the plasma processing is not normally performed, resulting in a decrease of the yield.

As a means for improving plasma ignitability, a preset function may be exemplified that presets a specific position of a needle (probe) of a tuner that performs a power control. While a method for implementing the preset function has been conventionally proposed in impedance matching by a variable matcher, no simple method for deciding an optimal preset position in impedance matching by a tuner exists in the present circumstances. Thus, conventionally, all the available settings are implemented to find out and decide an optimal preset position from the settings, which requires a significant time to decide a preset position.

For example, Japanese Patent Laid-Open Publication No. 06-188221 discloses a microwave auto-tuner that directly detects an emission intensity of plasma and tunes microwaves such that the detection value becomes maximum. Japanese Patent Laid-Open Publication No. 05-094955 discloses a plasma processing apparatus, in which a tuner and a microwave generator are controlled such that in-plane density distribution of microwave discharge plasma may be uniformized.

SUMMARY

The present disclosure provides a method for presetting a tuner that matches a power required for plasma emission in a plasma processing apparatus. The method includes: obtaining a relationship of a time lapse from power supply, an emission intensity of plasma, and a setting position of the tuner by emitting plasma; differentiating the emission intensity by time to calculate a time when an increase rate of the emission intensity becomes maximum; and setting the setting position of the tuner at a time, which is obtained by subtracting a time required from the setting of the tuner until the setting is reflected on the emission intensity from the time when the increase rate of the emission intensity becomes maximum, as a preset position.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 4A to 4C are graphs illustrating a method for presetting a tuner according to an exemplary embodiment of the present disclosure, in which FIG. 4A is a graph representing a relationship between time and an emission intensity at the time of preliminary emission, FIG. 4B is a graph obtained by smoothing the data of FIG. 4A, and FIG. 4C is a graph obtained by differentiating the data of FIG. 4B by time.

FIGS. 5A and 5B are graphs illustrating the method for presetting a tuner according to the exemplary embodiment of the present disclosure, in which FIG. 5A is a graph representing a relationship between a time and an emission intensity at the time of preliminary emission, FIG. 5B is a graph representing a relationship between time and a position of a probe of a tuner at the time of preliminary emission.

FIG. 6 is a view illustrating a conventional method for deciding a preset position of a tuner.

FIGS. 7A and 7B are graphs representing an exemplary embodiment of the present disclosure, in which FIG. 7A is a graph representing a relationship between a time and an emission intensity at the time of preliminary emission, and FIG. 7B is a graph representing a relationship between a time and an emission intensity after presetting of a tuner.

FIGS. 8A to 8C are graphs for another exemplary embodiment of the present disclosure, in which FIG. 8A is a graph representing a relationship between a time and an emission intensity at the time of preliminary emission, FIG. 8B is a graph obtained by smoothing the data of FIG. 8A, and FIG. 8C is a graph obtained by differentiating the data of FIG. 8B by time.

FIGS. 9A to 9C are graphs for another exemplary embodiment of the present disclosure, in which FIG. 9A is a graph representing a relationship between a time and an emission intensity at the time of preliminary emission, FIG. 9B is a graph obtained from smoothing the data of FIG. 9A, and FIG. 9C is a graph obtained from differentiating the data of FIG. 9B by time.

DETAILED DESCRIPTION

Figure 1:
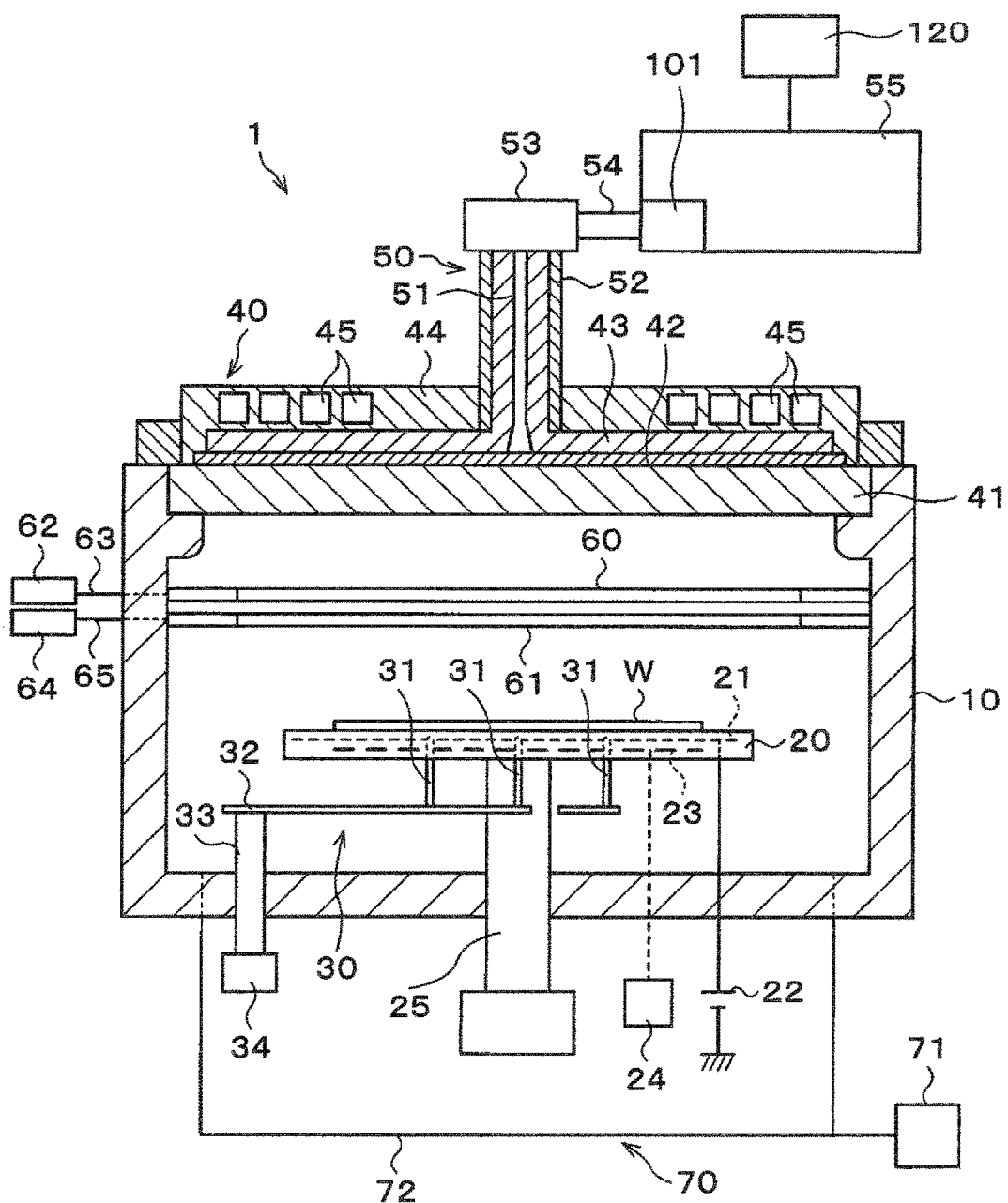
FIG. 1 is a vertical cross-sectional view illustrating a schematic configuration of a plasma processing apparatus according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Japanese Patent Laid-Open Publication No. 06-188221 describes performing tuning after plasma ignition to improve ignitability, but the tuning is not intended to decide a preset position for improving the ignitability. The disclosure of Japanese Patent Laid-Open Publication No. 05-094955 also cannot be applied to the improvement of the ignition of surface-wave plasma.

The present disclosure has been made in view of the circumstances described above, and an object thereof is to provide a method for presetting a tuner to effectively decide an optimal preset position for improving ignitability of plasma in a plasma processing apparatus that performs a plasma processing on a processing target object, and a plasma processing apparatus that performs the method.

In order to achieve the object, the present disclosure provides a method for presetting a tuner that matches a power required for plasma emission in a plasma processing apparatus. The method includes: obtaining a relationship of a time lapse from power supply, an emission intensity of plasma, and a setting position of the tuner by emitting plasma; differentiating the emission intensity by time to calculate a time when an increase rate of the emission intensity becomes maximum; and setting the setting position of the tuner at a time, which is obtained by subtracting a time required from the setting of the tuner until the setting is reflected on the emission intensity from the time when the increase rate of the emission intensity becomes maximum, as a preset position.

In the method for presetting a tuner, data representing the relationship between the time lapse from the power supply and the emission intensity may be smoothed by a moving average, and then, differentiated by time.

Another aspect of the present disclosure provides a plasma processing apparatus including: a processing container configured to accommodate a processing target object and perform a plasma processing thereon; a plasma generating mechanism that includes a high frequency generator provided outside the processing container, and generates plasma within the processing container by using high frequency waves generated by the high frequency generator, the high frequency generator including a tuner configured to match a power required for plasma emission; and a controller configured to control the plasma generating mechanism. The controller is configured to: obtain a relationship of a time lapse from power supply, an emission intensity of plasma, and a setting position of the tuner, differentiate the emission intensity by time to calculate a time when an increase rate of the emission intensity becomes maximum, and set the setting position of the tuner at a time, which is obtained by subtracting a time required from the setting of the tuner until the setting is reflected on the emission intensity from the time when the increase rate of the emission intensity becomes maximum, as a preset position.

In addition, the time from the setting of the tuner until the setting is reflected on the emission intensity refers to, for example, a time required from a time when a movable short circuit plate of the tuner begins to move toward a position calculated by an operation circuit of the tuner until the plate reaches a desired position.

According to the present disclosure, an optimal preset position of the tuner for improving the ignitability of plasma may be effectively decided, and a stable plasma processing may be performed in a plasma processing apparatus that performs a plasma processing on a processing target object.

Hereinafter, exemplary embodiments of the present disclosure will be described with reference to the accompanying drawings.

FIG. 1 is a vertical cross-sectional view illustrating a schematic configuration of a plasma processing apparatus 1 according to an exemplary embodiment of the present disclosure. The plasma processing apparatus 1 is a film forming apparatus that includes a plasma generating mechanism configured to perfoini a plasma chemical vapor deposition (CVD) processing on a surface (a top surface) of a wafer W as a processing target object. The present disclosure is not limited to the exemplary embodiments to be described hereinafter.

The plasma processing apparatus 1 has a processing container 10 as illustrated in FIG. 1. The processing container 10 has a substantially cylindrical shape and includes an opened ceiling. A radial line slot antenna 40 is provided in the ceiling opening. A carry-in/out port (not illustrated) for the wafer W is formed in the side wall of the processing container 10. A gate valve (not illustrated) is installed in the carry-in/out port. The processing container 10 is configured such that its interior can be sealed. A metal such as, for example, aluminum or stainless steel is used for the processing container 10. The processing container 10 is electrically grounded.

On a bottom portion inside the processing container 10, a cylindrical placement table 20 is installed which is configured to place the wafer W on a top surface thereof. For example, AlN is used for the placement table 20.

An electrode 21 for an electrostatic chuck is provided inside the placement table 20. The electrode 21 is connected to a DC power supply 22 installed outside the processing container 10. By the DC power supply 22, a Johnson-Rahbek force is generated on the top surface of the placement table 20, so that the wafer W may be electrostatically attracted onto the placement table 20.

In addition, a temperature adjusting mechanism 23 configured to circulate, for example, a cooling medium therein is installed in the inside of the placement table 20. The temperature adjusting mechanism 23 is connected to a liquid temperature adjustment unit 24 that is installed outside the processing container 10 and configured to adjust the temperature of the cooling medium. The temperature of the cooling medium is controlled by the liquid temperature adjustment unit 24, so that the temperature of the placement table 20 can be controlled. As a result, the wafer W placed on the placement table 20 may be maintained a predetermined temperature.

In addition, a high frequency power supply for RF bias (not illustrated) may be connected to the placement table 20.

The high frequency power supply outputs high frequency waves having a predetermined frequency suitable for controlling energy of ions to be drawn to the wafer W, for example, high frequency waves of 13.56 MHz with a predetermined power.

In addition, through holes (not illustrated) that penetrate the placement table 20 in the thickness direction of the placement table 20 are formed at, for example, three (3) locations of the placement table 20. Lift pins 31 to be described later are inserted through the through holes, respectively.

A support member 25 configured to support the placement table 20 is provided on the bottom surface of the placement table 20.

Below the placement table 20, a lifting mechanism 30 is installed so as to properly lift the wafer W placed on the placement table 20. The lifting mechanism 30 includes lift pins 31, a plate 32, a support column 33, and a lift driving unit 34. For example, three lift pins 31 are installed on the top surface of the plate 32 and configured to be capable of being protruding from the top surface of the placement table 20. The plate 32 is supported on the top end of the support column 33 penetrating the bottom wall of the processing container 10. The lift driving unit 34 is placed outside the processing container 10 and installed on the bottom end of the support column 33. When the lift driving unit 34 is operated, the three lift pins 31, which penetrate the placement table 20, are elevated and switch between a state where the lift pins 31 protrude upwardly from the top surface of the placement table 20 and a state where the top ends of the lift pins 31 are drawn to the inside of the placement table 20.

A radial line slot antenna configured to supply microwaves for plasma generation is installed in the ceiling opening of the processing container 10. The radial line slot antenna 40 includes a dielectric window 41, a slot plate 42, a slow wave plate 43, and a shield cover 44.

The dielectric window 41 is installed to seal the ceiling opening of the processing container 10 by a seal material such as, for example, an O-ring (not illustrated). Accordingly, the inside of the processing container 10 is hermetically kept. A dielectric material such as, for example, quartz, $Al_2O_3$ or MN, is used for the dielectric window 41, and the dielectric window 41 transmits microwaves.

The slot plate 42 is installed on the top surface of the dielectric window 41 to be opposite to the placement table 20. A conductive material such as, for example, copper, aluminum or nickel is used for the slot plate 42.

The slow wave plate 43 is mounted on the top surface of the slot plate 42. A low loss dielectric material such as, for example, quartz, $Al_2O_3$ or AlN is used for the slow wave plate 43. The slow wave plate 43 shortens the wavelength of microwaves.

The shield cover 44 is mounted on the top surface of the slow wave plate 43 to cover the slow wave plate 43 and the slot plate 42. In the inside of the shield cover 44, a plurality of annular flow paths 45 are provided so as to allow, for example, a cooling medium to circulate therethrough. By the cooling medium flowing in the flow paths 45, the dielectric window 41, the slot plate 42, the slow wave plate 43, and the shield cover 44 are controlled to a predetermined temperature.

A coaxial waveguide 50 is connected to the central portion of the shield cover 44. The coaxial waveguide 50 includes an inner conductor 51 and an outer conductor 52. The inner conductor 51 is connected with the slot plate 42. The lower end of the internal conductor 51 is formed in a conical shape that corresponds to a taper shape of which the diameter increases toward the slot plate 42 side. By the lower end, microwaves are adapted to be efficiently propagated to the slot plate 42.

To the coaxial waveguide 50, a mode converter 53 configured to convert microwaves into a predetermined vibration mode, a rectangular waveguide 54, and a microwave generator 55 configured to generate microwaves of a high frequency are connected in this order from the coaxial waveguide 50 side. The microwave generator 55 generates microwaves of a predetermined frequency, for example, microwaves of 2.45 GHz.

Figure 2:
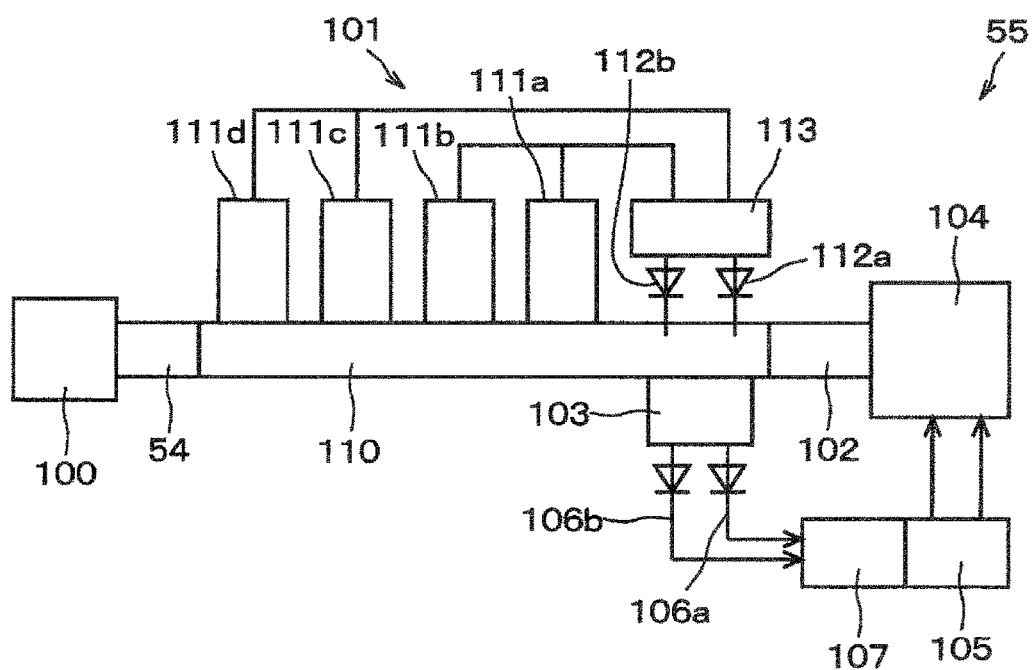
FIG. 2 is a schematic view illustrating a configuration around a tuner included in a microwave generator.

As illustrated in FIG. 2, the microwave generator 55 includes a tuner 101 serving as a matcher, an isolator 102, a directional coupler 103, an oscillation unit 104, and a high voltage power supply 105. The directional coupler 103 is provided inside a waveguide path 110 connected to the rectangular waveguide 54 and partially branches traveling waves traveling in the inside of the waveguide path 110 and reflection waves reflected from a load side. The oscillation unit 104 includes a magnetron as a microwave oscillator. The high voltage power supply 105 supplies a power to the magnetron. The isolator 102 transmits a frequency signal in one direction from the magnetron toward the tuner 101 side provided on the load 100 side. Here, the load 100 refers to a member provided at the downstream side of the rectangular waveguide 54 such as, for example, the mode converter 53.

The tuner 101 includes four (4) movable short circuit units 111a, 111b, 111c and 111d having movable short circuit plates (not illustrated), respectively, which are provided to be spaced apart from each other toward the traveling direction of the microwaves, and two (2) probes 112a and 112b provided on the oscillation unit 104 side with respect to the movable short circuit unit 111a. The positions of the movable short circuit plates (not illustrated) that correspond to the two (2) probes 112a and 112b, respectively, are calculated by an operation circuit 113 that is connected to the two probes 112a and 112b.

In addition, the tuner 101 includes the directional coupler 103 that is provided on the oscillation unit 104 side with respect to the movable short circuit unit 111a. The directional coupler 103 is bi-directional. By using the directional coupler 103, a power signal of traveling waves that travel within the waveguide path 110 is transmitted, via a circuit 106a, to the voltage control circuit 107 provided in the microwave generator 55. Also, by using the directional coupler 103, a power signal of reflection waves traveling within the waveguide path 110 is transmitted, via a circuit 106b, to the voltage control circuit 107 provided in the microwave generator 55. A voltage control signal is transmitted from the voltage control circuit 107 to perform a control of the voltage to be applied to the magnetron.

With this configuration, the microwaves generated by the microwave generator 55 are sequentially propagated to the rectangular waveguide 54, the mode converter 53, and the coaxial waveguide 50, supplied into the radial line slot antenna 40, and compressed by the slow wave plate 43 so that the wavelength of the microwaves is shortened. After generating circularly polarized microwaves by the slot plate 42, the microwaves are transmitted through the dielectric window 41 to be radiated into the inside of the processing container 10. By the microwaves, a processing gas is turned into plasma within the processing container 10, and a plasma processing is performed on a wafer W by the plasma.

An upper shower plate 60 and a lower shower plate 61 are provided above the placement table 20 within the processing container 10. The upper and lower shower plates 60 and 61 are formed of a hollow pipe material such as, for example, quartz. In the upper and lower shower plates 60 and 61, a plurality of openings (not illustrated) are provided to supply a gas to the wafer W placed on the placement table 20.

A plasma generation gas supply source 62 provided outside the processing container 10 is connected to the upper shower plate 60 via a pipe 63. A plasma generation gas, such as, for example, Ar gas, is stored in the plasma generation gas supply source 62. The plasma generation gas from the plasma generation gas supply source 62 is introduced into the upper shower plate 60 via the pipe 63, and supplied to the inside of the processing container 10 to be uniformly dispersed therein.

A processing gas supply source 64 provided outside the processing container 10 is connected to the lower shower plate 61 via a pipe 65. A processing gas according to a film to be formed is stored in the processing gas supply source 64. For example, when a SiN film is formed on the surface of the wafer W, for example, trisilylamine (TSA), $N_2$ gas or $H_2$ gas is stored as a processing gas. When a $SiO_2$ film is formed, for example, TEOS is stored. The processing gas from the processing gas supply source 64 is introduced into the lower shower plate 61 via the pipe 65, and supplied to the inside of the processing container 10 to be uniformly dispersed therein.

On the bottom surface of the processing container 10, a decompressing mechanism 70 is installed so as to decompress the inside of the processing container 10. The decompressing mechanism 70 is configured such that, for example, an exhaust unit 71 provided with a vacuum pimp is connected to the bottom surface of the processing container 10 through an exhaust line 72. The exhaust unit 71 may evacuate atmosphere within the processing container 10 so as to decompress the inside of the processing container 10 to a predetermined vacuum level.

The above-described plasma processing apparatus 1 is provided with a controller 120, as illustrated in FIG. 1. The controller 120 is, for example, a computer and has a program storage unit (not illustrated). In the program storage unit, programs are stored to control the plasma generating mechanism in the plasma processing apparatus 1. In addition, the programs may be those recorded in a computer-readable record medium such as, for example, a computer-readable hard disc (HD), a flexible disc (FD), a compact disc (CD), a magneto optical (MO) disc, or a memory card, and installed in the controller 100 from the record medium.

Next, descriptions will be made on the plasma processing of a wafer W that is performed in the plasma processing apparatus 1 configured as described above.

First, the wafer W carried into the processing container 10 is placed on the placement table 20 by the lift pins 31. At this time, the DC power supply 22 is turned ON to apply a DC voltage to the electrode 21 of the placement table 20, and the wafer W is attracted to and held by the placement table 20.

Then, after the inside of the processing container 10 is hermetically sealed, and the atmosphere within the processing container 10 is decompressed to a predetermined pressure, for example, 400 mTorr (=53 Pa) by the decompressing mechanism 70. In addition, a plasma generation gas is supplied from the upper shower plate to the inside of the processing container 10, and a plasma film fo iation processing gas is supplied from the lower shower plate 61 to the inside of the processing container 10.

When the plasma generation gas and the processing gas are supplied into the processing container 10, the microwave generator 43 is operated, and microwaves of, for example, a 2.45 GHz frequency are generated in the microwave generator 43 with a predetermined power. Then, an electric field is generated on the bottom surface of the dielectric window 41, the plasma generation gas is turned into plasma, and the processing gas is further turned into plasma, so that a film formation processing is performed on the wafer W by active species generated at that time. As a result, a predetermined film is formed on the surface of the wafer W.

Thereafter, when the predetermined film is grown so that a film with a predetermined thickness is formed on the wafer W, the supply of the plasma generation gas and the processing gas and the irradiation of the microwaves are stopped. Thereafter, the wafer W is carried out from the processing container 10, and a series of plasma film formation processings are terminated.

The inventor of the present disclosure discovered that when the plasma processing is performed, a timing at which the emission intensity of plasma begins to rapidly increase corresponds to a timing at which the matching of ignition is taken, and that the positions of the probes 112a and 112b of the tuner 101 at that timing are optimal as a preset position of the tuner 101.

Hereinafter, a process of a method for presetting a tuner according to an exemplary embodiment of the present disclosure will be described with reference to FIGS. 3 to 5B.

Figure 3:
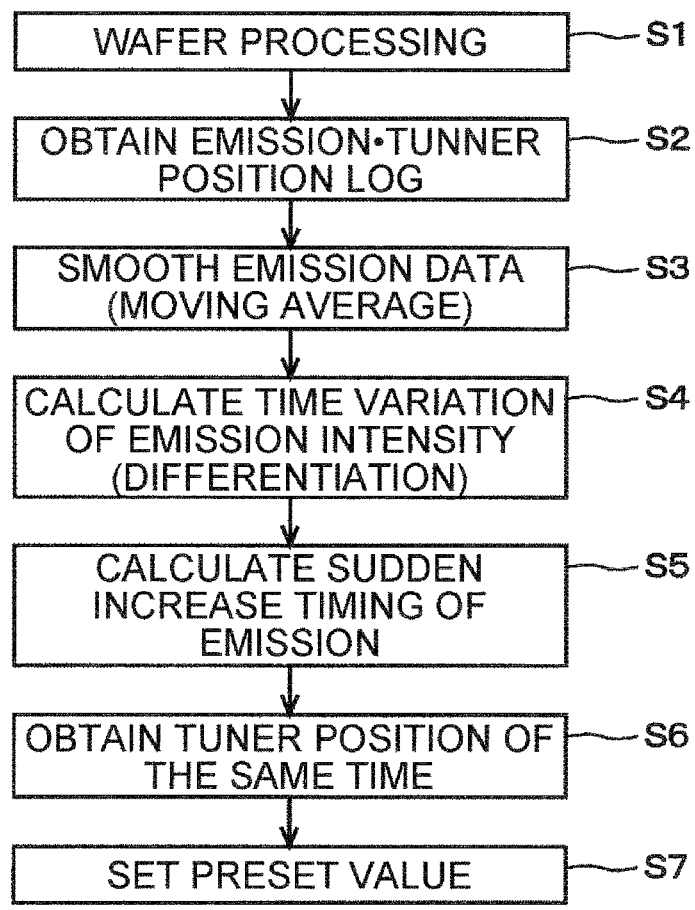
FIG. 3 is a flowchart illustrating a process for presetting a tuner according to an exemplary embodiment of the present disclosure.

First, a plasma processing is performed as preliminary emission on the wafer W placed in the processing container 10 (step S1 in FIG. 3). In this case, the wafer W may be a processing target object on which the plasma processing is actually performed, or a dummy wafer. The wafer W may also be applied at a cleaning recipe. Then, data for emission intensity and the position of the tuner at the time of the preliminary emission are obtained (step S2). These data may be obtained by a device that is mounted within a conventional plasma processing apparatus.

Figure 4A:
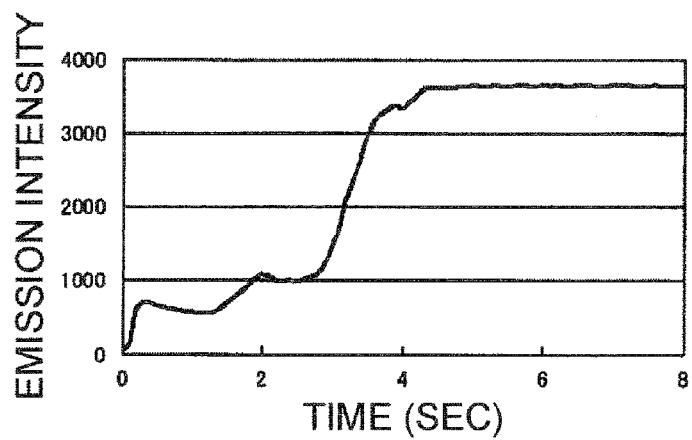
Figure 4B:
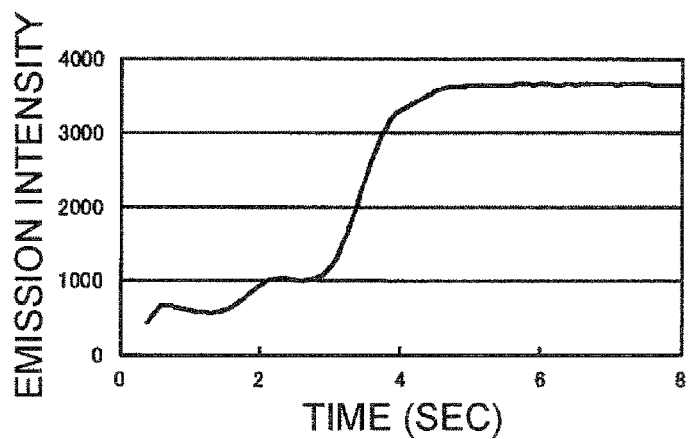

FIG. 4A is a graph representing a relationship between a time lapse from power supply and an emission intensity. Since the raw data for the emission intensity include noise, the data are smoothed by a moving average as illustrated in FIG. 4B (step S3). A variation rate of the emission intensity $df(t)/dt$, which is obtained by differentiating the smoothed emission intensity $f(t)$ by time $t$, is calculated (step S4).

Figure 4C:
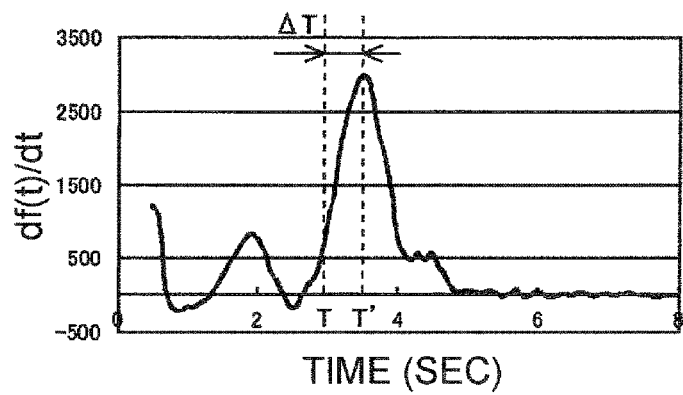

FIG. 4C is a graph representing a relationship between a time lapse and $df(t)/dt$. From the graph, the time T' at which the variation rate of the emission intensity $df(t)/dt$ becomes maximum is calculated. In FIG. 4C, T' is after about 3.4 seconds from the power supply. A time $\Delta T$ is required until the position of the tuner is reflected to the emission intensity and determined according to the performance of the tuner. That is, the time T at which the tuner is at an optimal matching position is calculated by $$T=T'-\Delta T$$

In the present exemplary embodiment, $\Delta T$ is about 0.5 seconds, and the state of the tuner after about 2.9 seconds from the power supply corresponds to the time at which the emission intensity rapidly increases, i.e., the time at which matching of ignition is taken. The state of the tuner at this time is set as a preset position.

Figure 5A:
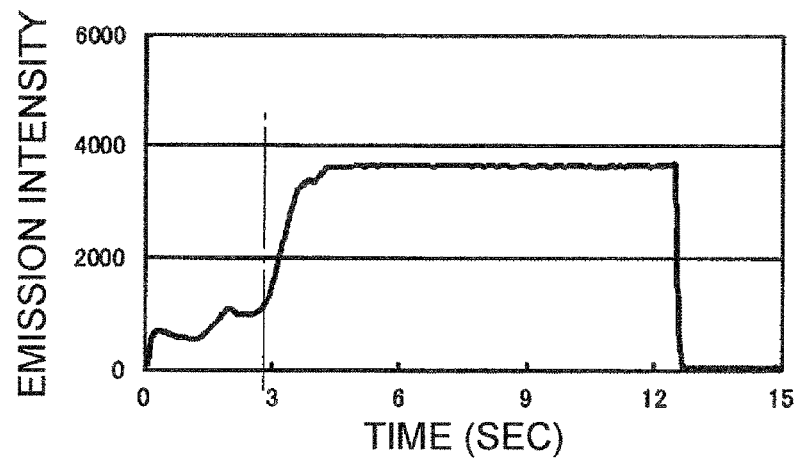
Figure 5B:
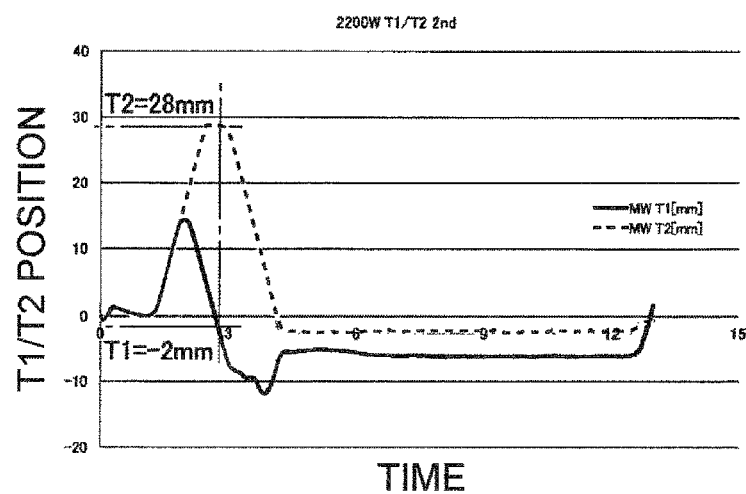

FIG. 5A is a graph representing a relationship between a time lapse from the power supply and an emission intensity. FIG. 5B is a graph of which the horizontal axis refers to the same time as that in FIG. 5A, and the vertical axis refers to positions T1 and T2 of the probes of the tuner depending on time. From FIG. 5B, data are obtained in which the positions of the probes after about 2.9 seconds from the power supply are T1: −2 mm and T2: 28 mm (step S6). The positions T1 and T2 of the probes are set as the preset position to efficiently perform plasma emission in the plasma processing of the present exemplary embodiment (step S7).

As described above, according to the present exemplary embodiment, a plasma intensity and a preset position of a tuner are detected by an existing device equipped in a plasma processing apparatus, and the above-described calculations are performed for the detected data. Thus, from plasma emission (preliminary emission) conducted once, an optimal reset position of a tuner in the plasma processing at the corresponding step may be quickly and easily detected. Therefore, a stable plasma processing may be performed, and thereby, improving the yield of products.

In the foregoing, exemplary embodiments of the present disclosure have been described, but the present disclosure is not limited thereto. It is evident that a person ordinarily skilled in the art can conceive various changes and modifications within the scope of the technical idea defined in the claims, and it is understood the changes and modifications naturally belong to the technical scope of the present disclosure.

EXAMPLES

A plasma processing was performed with plasma (pressure: 100 mT, flow rate ratio ($Ar/HBr/O_2$): 1000 sccm/600 sccm/6 sccm, microwave power: 2200 W), and a preset position of the tuner was set by using an emission wavelength of Ar.

From FIGS. 4A to 4C, and FIGS. 5A and 5B described with respect to the above-described exemplary embodiment, a preset position of the probes was set to T1: −2 mm and T2: 28 mm.

Figure 6:
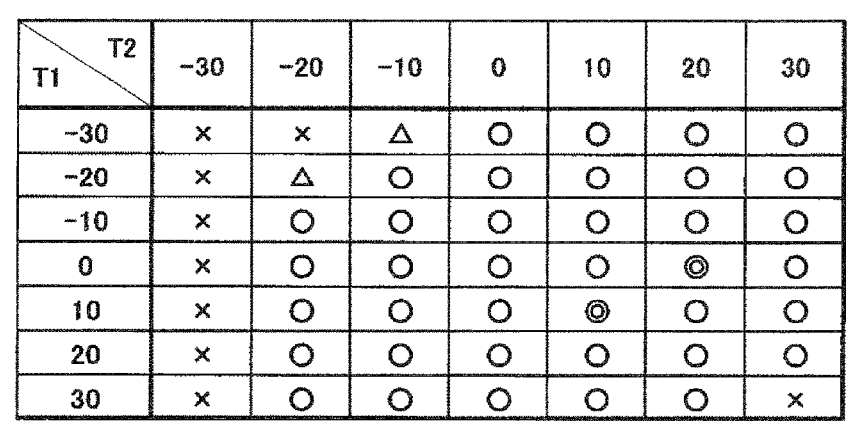

For a conventional example, as illustrated in FIG. 6, a power was applied to for total forty-nine (49) positions determined by combining seven (7) positions T1 and seven (7) positions T2 of the two (2) probes of the tuner, and the emission intensities were measured at the time of ignition in order to investigate a condition at which the level of an emission intensity, i.e., ignitability is good. The conditions for the best ignitability were T1: 0 mm and T2: 20 mm, and T1: 10 mm and T2: 10 mm. This result was almost equal to T1: −2 mm and T2: 28 mm in the exemplary embodiment of the present disclosure. Even with the conventional method, the ignitability may be also improved by finding a condition for good ignitability by repeating the adjustment of a tuner again and again. However, since it is not possible to calculate the optimal position unless all possible positions of the probes are investigated, too much time and labor are required.

Figure 7A:
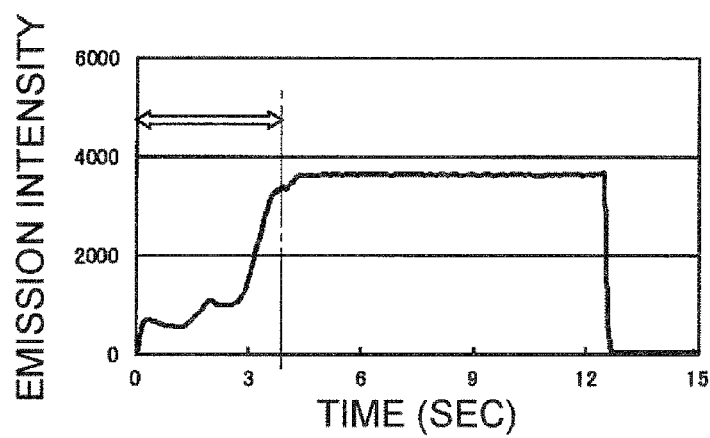
Figure 7B:
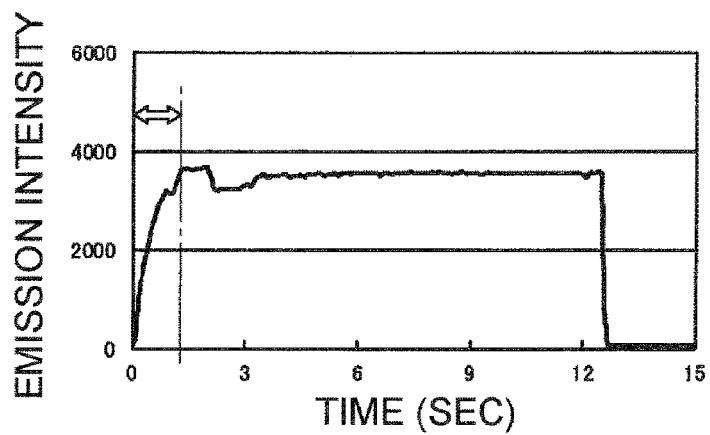

FIG. 7A is a graph representing a relationship between a time lapse and an emission intensity when a plasma processing was performed prior to preset. FIG. 7B is a graph presenting a relationship between a time lapse and an emission intensity when a plasma processing was performed after the preset according to the exemplary embodiment of the present disclosure was performed. Prior to the preset, about four (4) seconds were required until the plasma ignition. However, when the preset of the exemplary embodiment of the present disclosure was performed, a time slightly exceeding one (1) second was taken until the plasma ignition so that the time required for the ignition was greatly reduced.

In addition, since the variation rate of the emission intensity is used for determination of the ignition, plasma based on any gas may be applied. Any emission wavelength may be used for the determination as long as it has an intensity exhibiting an observable variation.

Figure 8A:
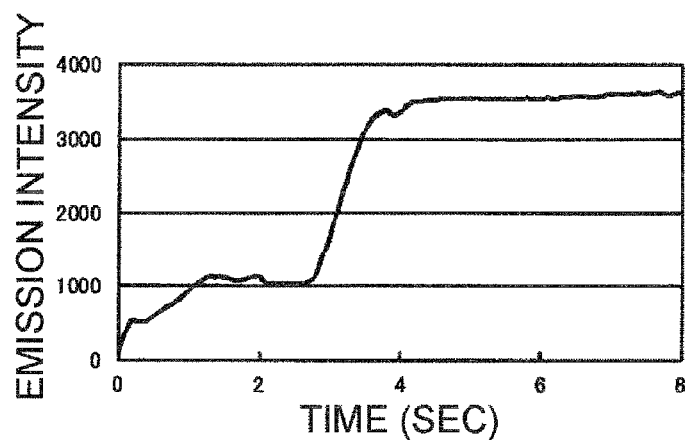
Figure 8B:
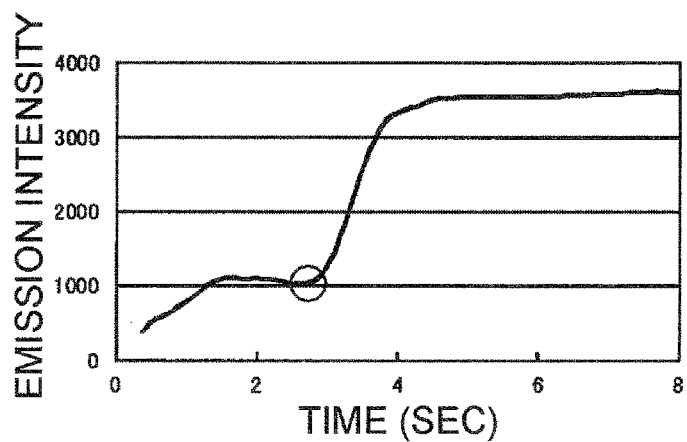
Figure 8C:
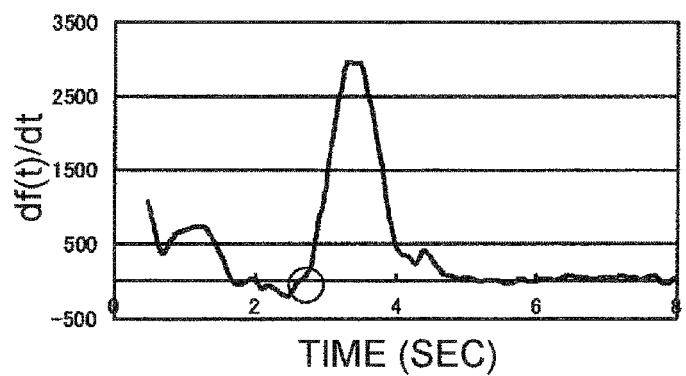
Figure 9A:
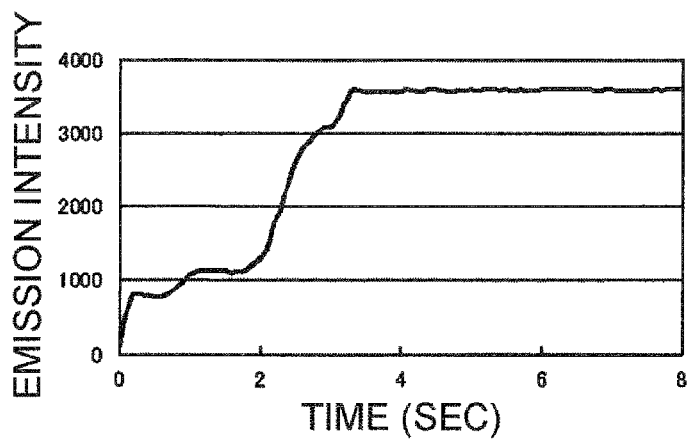
Figure 9B:
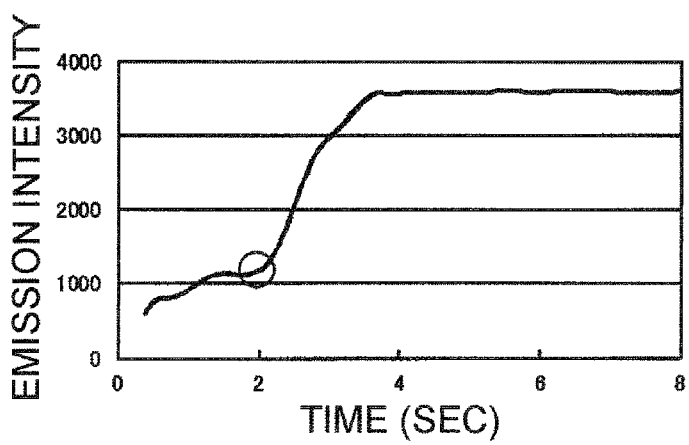
Figure 9C:
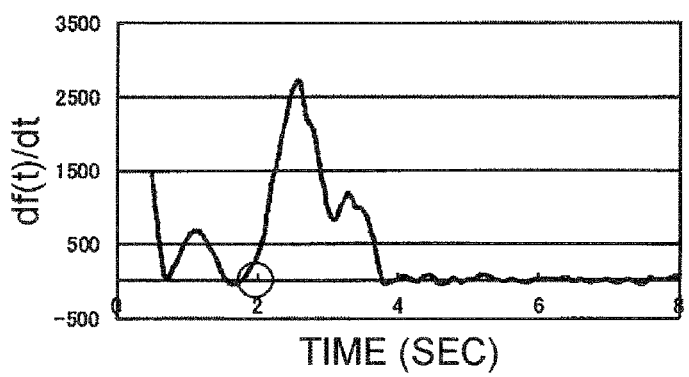

Meanwhile, FIGS. 8A to 8C and FIGS. 9A to 9C relate to other exemplary embodiments. FIGS. 8A and 9A are graphs representing a relationship between a time and an emission intensity at the time of preliminary emission. FIGS. 8B and 9B are graphs obtained from smoothing the data of FIGS. 8A and 9A, respectively. FIGS. 8C and 9C are graphs obtained by differentiating the data of FIGS. 8B and 9B by time, respectively. The plasma processing condition was the same as that in the above-described exemplary embodiment. That is, the condition of used plasma was as follows: pressure; 100 mT, microwave power; 2200 W, and flow rate ratio ($Ar/HBr/O_2$): 1000 sccm/600 sccm/6 sccm. In all the cases, the sudden increase timing of an emission spectrum obtained by visual observation was equal to the timing calculated from the emission intensity by the method of the present disclosure.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method for presetting a tuner of a plasma processing apparatus that matches a power required for plasma emission in the plasma processing apparatus including a controller, the method comprising:

generating, by the controller, plasma in a processing chamber of the plasma processing apparatus;

calculating, by the controller, a relationship between a time lapse from power supply and an emission intensity of the plasma, and a relationship between the time lapse from the power supply and a setting position of the tuner in the plasma processing apparatus;

differentiating, by the controller, the emission intensity by time and calculating, by the controller, a time when an increase rate of the emission intensity becomes maximum; and setting, by the controller, the setting position of the tuner at a time, which is obtained by subtracting a time required from the setting of the tuner until the setting is reflected on the emission intensity from the time when the increase rate of the emission intensity becomes maximum, as a preset position.

2. The method for presetting the tuner of the plasma processing apparatus according to claim 1, further comprising:

smoothing, by the controller, data representing the relationship between the time lapse from the power supply and the emission intensity by a moving average, and then, differentiating the data by time.

3. A plasma processing apparatus comprising:

a processing container configured to accommodate a processing target object and perform a plasma processing thereon;

a plasma generating mechanism that includes a high frequency generator provided outside the processing container, and generates plasma within the processing container by using high frequency waves generated by the high frequency generator, the high frequency generator including a tuner configured to match a power required for plasma emission; and a controller configured to control the plasma generating mechanism, wherein the controller is configured to:

obtain a relationship of a time lapse from power supply, an emission intensity of plasma, and a setting position of the tuner, differentiate the emission intensity by time to calculate a time when an increase rate of the emission intensity becomes maximum, and set the setting position of the tuner at a time, which is obtained by subtracting a time required from the setting of the tuner until the setting is reflected on the emission intensity from the time when the increase rate of the emission intensity becomes maximum, as a preset position.

* * * * *